US006423990B1

(12) United States Patent
El-Sharawy et al.

(10) Patent No.: US 6,423,990 B1
(45) Date of Patent: *Jul. 23, 2002

(54) VERTICAL HETEROJUNCTION BIPOLAR TRANSISTOR

(75) Inventors: El-Badawy Amien El-Sharawy, Gilbert, AZ (US); Majid M. Hashemi, San Jose, CA (US)

(73) Assignee: National Scientific Corporation, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/441,576

(22) Filed: Nov. 17, 1999

Related U.S. Application Data

(60) Continuation-in-part of application No. 09/267,252, filed on Mar. 12, 1999, now Pat. No. 6,171,920, which is a division of application No. 08/939,487, filed on Sep. 29, 1997, now Pat. No. 5,912,481.

(51) Int. Cl.[7] .......................................... H01L 31/0328
(52) U.S. Cl. ....................... 257/197; 257/183; 257/198; 257/200
(58) Field of Search ............................... 257/197, 198, 257/200, 183

(56) References Cited

U.S. PATENT DOCUMENTS

| 3,984,857 A | 10/1976 | Mason | ........................ 357/16 |
| 4,120,706 A | 10/1978 | Mason | ....................... 148/175 |

(List continued on next page.)

FOREIGN PATENT DOCUMENTS

| JP | 60-175450 | * 9/1985 | ........... H01L/29/72 |
| JP | 62178251 | * 7/1987 | ..................... 29/72 |
| JP | 63-23992 | * 10/1988 | ........... H01L/21/20 |

OTHER PUBLICATIONS

C.C. Hu, et al., "The Fabrication of InGaP/Si Light Emitting Diode by Metal–Organic Chemical Vapor Deposition," 1997, Materials Chemistry and Physics 48, pp. 17–20.

Susumo Kondo, et al., "InGaP Orange Light Emitting Diodes on Si–Substrates," Nov. 6, 1989, Appl. Phys. Lett. 55 (19), pp. 1981–1983.

S.F. Fang, et al., "Gallium Arsenide and Other Compound Semi–Conductors on Silicon," J. Appl. Phys. 68(7), Oct. 1, 1990, pp. R31–R58.

(List continued on next page.)

Primary Examiner—Tom Thomas
Assistant Examiner—Ori Nadav
(74) Attorney, Agent, or Firm—Lowell W. Gresham; Charlene R. Jacobsen; Meschkow & Gresham, P.L.C.

(57) ABSTRACT

A heterojunction bipolar transistor (20, 60) is provided with a silicon (Si) base region (34, 74) that forms a semiconductor junction with a multilayer emitter (38) having a thin gallium arsenide (GaAs) emitter layer (36, 72) proximate the base region (34, 74) and a distal gallium phosphide (GaP) emitter layer (40, 66). The GaAs emitter layer (36, 72) is sufficiently thin, preferably less than 200 Å, so as to be coherently strained. In one embodiment, the GaP emitter layer includes a doped region (70) which serves as the emitter and a non-doped region (68) on which the intrinsic portion of the transistor (60) is formed.

2 Claims, 7 Drawing Sheets

U.S. PATENT DOCUMENTS

| | | | |
|---|---|---|---|
| 4,180,825 A | | 12/1979 | Mason .................. 357/16 |
| 4,233,613 A | | 11/1980 | Morimoto .................. 357/16 |
| 4,588,451 A | | 5/1986 | Vernon .................. 148/175 |
| 4,706,100 A | | 11/1987 | Tufte .................. 357/16 |
| 4,876,210 A | * | 10/1989 | Barnett et al. .................. 437/5 |
| 4,928,154 A | | 5/1990 | Umeno et al. .................. 357/16 |
| 4,959,702 A | | 9/1990 | Mayer et al. .................. 357/34 |
| 4,983,534 A | | 1/1991 | Kikuta .................. 437/31 |
| 5,016,065 A | | 5/1991 | Seki et al. .................. 357/16 |
| 5,053,835 A | | 10/1991 | Horikawa et al. .................. 357/16 |
| 5,081,519 A | | 1/1992 | Nishimura .................. 357/60 |
| 5,091,333 A | | 2/1992 | Fan et al. .................. 437/82 |
| 5,134,446 A | | 7/1992 | Inoue .................. 257/190 |
| 5,144,379 A | | 9/1992 | Eshita et al. .................. 257/190 |
| 5,198,689 A | | 3/1993 | Fujioka .................. 257/197 |
| 5,281,834 A | | 1/1994 | Cambou et al. .................. 257/200 |
| 5,422,502 A | | 6/1995 | Kovacic .................. 257/197 |
| 5,426,316 A | | 6/1995 | Mohammad .................. 257/197 |
| 5,473,174 A | | 12/1995 | Ohsawa .................. 257/190 |
| 5,512,496 A | * | 4/1996 | Chau et al. .................. 437/31 |
| 5,523,243 A | | 6/1996 | Mohammad .................. 438/312 |
| 5,708,281 A | | 1/1998 | Morishita .................. 257/198 |
| 5,734,183 A | | 3/1998 | Morishita .................. 257/197 |
| 5,789,800 A | | 8/1998 | Kohno .................. 257/197 |
| 5,912,481 A | * | 6/1999 | El-Sharawy et al. .................. 257/198 |

OTHER PUBLICATIONS

T. Soga, et al., "Electrical Properties of GaP on Si Grown By Metal Organic Chemical Vapor Deposition," Journal of Crystal Growth, 132(1993) pp. 414–418.

Suguira et al., "In Situ Observation of the Strain in GaP on Si During Cooling Step After Growth by Ramanspectroscopy," J. Appl. Phys. 77(8), Apr. 15, 1995, pp. 4009–4012.

Bachman et al., "Heteroepitaxy of Lattice Matched Compound Semiconductors on Silicon," J. Vac. Sci. Technol. A 13(3), May/Jun. 1995, pp. 696–704.

Wright, et al., "Molecular Beam Epitaxial Growth of GaP on Si," J. Appl. Phys. 55(8), Apr. 15, 1994, pp. 2916–2927.

Olson, et al., "MOCVD Growth and Characterization of GaP on Si", Journal of Crystal Growth, 77(1986) 515–523.

IBM Technical Disclosure Bulletin, vol. 32, pp. 120–121, "Doping of III–V Compounds by Channeled Implants and Its Applications".

* cited by examiner

VERTICAL HETEROJUNCTION BIPOLAR TRANSISTOR

RELATED PATENTS

The present invention is a Continuation-In-Part of: "Method Of Forming Heterojunction Bipolar Transistor Having Wide Bandgap, Low Interdiffusion Base-Emitter Junction," Ser. No. 09/267,252, filed on Mar. 12, 1999, now U.S. Pat. No. 6,171,920 which is a Division of: "Heterojunction Bipolar Transistor Having Wide Bandgap, Low Interdiffusion Base-Emitter Junction," Ser. No. 08/939,487, filed on Sep. 29, 1997, and issued on Jun. 15, 1999 as U.S. Pat. No. 5,912,481, both of which are incorporated herein by reference.

TECHNICAL FIELD OF THE INVENTION

The present invention relates generally to heterojunction bipolar transistors (HBTs).

BACKGROUND OF THE INVENTION

Heterojunction bipolar transistors (HBTs) theoretically provide advantages over conventional homojunction bipolar transistors by providing a heterojunction between a base and emitter of a transistor. A heterojunction is formed between two dissimilar semiconductor materials. Silicon (Si) exhibits a bandgap of around 1.12 eV, but a Si homojunction has no bandgap discontinuity at the junction. A bandgap discontinuity can occur at a junction by using dissimilar semiconductor materials on opposing sides of the junction. From the perspective of an NPN transistor, discontinuity in the valence band restricts hole flow from the base to the emitter, thus improving emitter injection efficiency and current gain. To the extent that injection efficiency and current gain improvements can be achieved, base region resistivity may be lowered (which lowers the base resistance) and emitter region resistivity may be raised (which lowers base-emitter junction capacitance) to create fast transistors without significantly compromising other device parameters. Such fast transistors would be useful for high speed digital, microwave and other integrated circuit and discrete transistor applications.

In practice, HBT performance often falls far short of the theoretical expectations. One conventional Si-based HBT reduces the bandgap of the base region by creating a base material having a narrower bandgap than Si. In particular, a small amount of germanium (Ge) is mixed with Si in the base ($Si_{1-x}Ge_x$), and the emitter is more purely Si. Unfortunately, the amount of bandgap difference ($\Delta Eg$) for as much as 20% Ge content in the base is only about 0.15 eV. This small $\Delta Eg$ achieves only a small portion of the performance benefits that HBTs theoretically promise.

Slight improvements in HBT performance have been achieved by using materials other than Si for the emitter of an HBT. Three emitter materials which have been investigated for use in HBT transistors are silicon carbide (SiC), which has a bandgap of 2.93 eV, gallium arsenide (GaAs) which has a bandgap of 1.42 eV, and gallium phosphide (GaP), which has a bandgap of 2.24 eV. Unfortunately, such materials have lattice constants which differ from Si. For example, SiC has a 20% lattice mismatch, GaAs has a 4% lattice mismatch, and GaP has a 0.34% lattice mismatch. Likewise, such materials have thermal expansion coefficients which differ from Si. SiC has a thermal expansion coefficient of about $2.6 \times 10^{-6}$ $(°C.)^{-1}$, while GaAs has a thermal expansion coefficient of around $6.7 \times 10^{-6}$ $(° C.)^{-1}$, and GaP has a thermal expansion coefficient of around $5.91 \times 10^{-6}$ $(° C.)^{-1}$. Because of these differences, only thin layers of these materials have been successfully grown on Si without the formation of significant defects. The maximum thickness for a low defect layer of SiC grown on Si is only a few angstroms (Å) and for GaAs grown on Si is less than 200 Å. At these thicknesses or less, strain which is caused by lattice mismatch is contained by lattice stretching rather than crystal defects. Thinner, low-defect thicknesses of these materials do not possess a sufficient thickness to protect the base-emitter junction from shorting due to diffusion of metal from the emitter contact region. Thicker, high-defect thicknesses of these materials exhibit degraded junction performance due to an excessive number of defects.

The most successful HBT improvements to date are believed to have been achieved by forming a GaP layer over Si at the base-emitter junction. GaP is desirable because it has a relative large bandgap (i.e. about 2.24 eV) and little lattice mismatch with silicon (i.e. about 0.34%). Nevertheless, such conventional HBTs that use a GaP layer over Si still achieve only a small portion of the performance benefits that HBTs theoretically promise. The reason for this poor performance appears to be that a Si—GaP junction suffers from an unusually large amount of interdiffusion, where the Ga and P readily diffuse into the Si, and vice-versa. The interdiffusion between Si and GaP results in a poor semiconductor junction, with the metallurgical junction being displaced from the electrical junction. Accordingly, the performance gains that are suggested by the wide bandgap difference between a Si base and a GaP emitter are not achieved in practice because the resulting diffuse junction negates those potential gains.

In the field of photoelectric semiconductors, it is desirable to form compound structures using a Si substrate and direct gap semiconductor materials. A Si substrate is desirable for mechanical stability and because a manufacturing infrastructure exists for reliably mass producing rugged Si wafers at relatively low cost. The Si substrate is typically an extrinsic part of the photoelectric semiconductor not used in forming intrinsic photoelectric semiconductor junctions.

Compound structures using a Si substrate and direct gap semiconductor materials suffer from problems similar to those discussed above for HBTs. Namely, lattice constant and thermal expansion coefficients for direct gap semiconductors differ from Si. Consequently, in attempting to produce low-defect compound semiconductors having direct gap semiconductors and a Si substrate, conventional photoelectric semiconductors often include very thick, highly doped buffer layers between the Si substrate and direct gap materials. Such buffer layers may include indirect gap materials, such as GaP and others, but these indirect gap materials are unsuitable for intrinsic photoelectric semiconductors.

Such buffer layers tend to incrementally shift lattice constants and thermal expansion coefficients so that the intrinsic direct gap photoelectric semiconductor materials may then be grown with fewer defects. Such applications often form relatively thick buffer layers which themselves may have numerous defects, at least closer to a Si interface, that are of little consequence to the intrinsic photoelectric semiconductor. Needless to say, such buffer layers are not used in forming semiconductor junctions.

U.S. Pat. No. 5,912,481, which describes prior work of the inventors of the present invention, describes an HBT that goes a long way toward providing performance benefits that HBTs theoretically promise. However, further improvements in speed, radiation tolerance characteristics, and thermal dissipation would be desirable.

Speed and radiation tolerance characteristics can both be enhanced by using an improved substrate in which, or on which, an intrinsic transistor is formed. Conventional techniques apply a silicon on insulator (SOI) technology. Typically, an intrinsic transistor is formed over an $SiO_2$ layer rather than over a semiconductor, such as Si. When hit by radiation, the $SiO_2$ layer does not produce the electron disturbances that are characteristic of a semiconductor, leading to radiation tolerance improvements. In addition, the insulative $SiO_2$ layer lowers capacitance, which leads to improvements in speed. However, $SiO_2$ is not a particularly good thermal conductor. Consequently, less heat is conducted away from the intrinsic transistor, fewer transistors can be placed near one another on an integrated circuit, and higher power devices are not practical.

Moreover, one conventional SOI technique forms a crystalline layer (e.g., Si) used in the formation of intrinsic transistors over the $SiO_2$ layer. Since $SiO_2$ is a porous material, not a crystalline material, the overlying crystalline layer often exhibits defects that cannot be cured by annealing. Accordingly, poor yields result. Another conventional SOI technique forms a single Si crystal, then implants oxygen ($O_2$) under high energy deep into the Si crystal and anneals to form a deep $SiO_2$ layer. Unfortunately, getting complete and uniform $SiO_2$ formation within an existing Si layer is extremely difficult. Consequently, this SOI technique is characterized by incomplete oxidation, which leads to a poor quality $SiO_2$ layer and only marginal speed and radiation tolerance improvements.

SUMMARY OF THE INVENTION

Accordingly, it is an advantage of the present invention that an improved heterojunction bipolar transistor (HBT) having a wide bandgap with low interdiffusion base-emitter junction and method therefor are provided.

Another advantage is that an HBT having a multilayer emitter is provided.

Another advantage is that an HBT is provided which has a wide bandgap emitter along with a base-emitter junction that is substantially free of interdiffusion.

Another advantage is that an HBT is provided with a Si base region that forms a junction with a multilayer emitter having a thin GaAs layer proximate the base region and a distal GaP layer.

Another advantage is that an HBT is provided that exhibits performance which more closely meets theoretical expectations than conventional HBTs.

Another advantage is that an HBT is provided which uses a Si substrate and a substantially insulative crystalline layer grown thereon.

Another advantage is that an intrinsic HBT is formed in and on a substantially insulative layer which is also a good thermal conductor.

The above and other advantages of the present invention are carried out in one form by a vertical heterojunction bipolar transistor which includes a gallium phosphide layer (GaP) configured to exhibit a first conductivity type. The GaP layer forms a first portion of a multilayer emitter. A gallium arsenide (GaAs) layer is formed in contact with the GaP layer. The GaAs layer forms a second portion of the multilayer emitter. A silicon (Si) base region of a second conductivity type is formed in contact with the GaAs layer. In addition, a Si collector region of the first conductivity type is formed adjacent to the Si base region.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

FIGS. 1–10 show sectional views of a heterojunction bipolar transistor (HBT) 20 configured in accordance with the present invention at first through tenth processing stages, respectively. The Figures illustrate an NPN implementation of the present invention, but those skilled in the art will realize that an equivalent PNP implementation is easily achieved by making routine substitutions well known to those skilled in the art.

Figure 1:
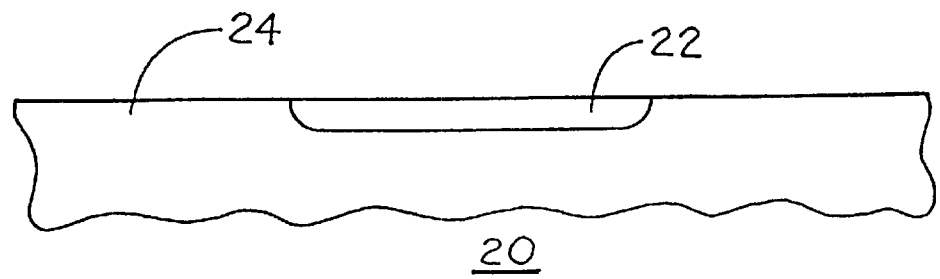
FIGS. 1–10 show sectional views of a first embodiment of an HBT at first through tenth processing stages, respectively.

FIG. 1 illustrates a first processing stage in which a buried region 22 is formed in a silicon (Si) substrate 24. Preferably, substrate 24 is lightly doped P-type conductivity, and buried region 22 is heavily doped through a standard ion implantation process to exhibit N-type conductivity for this NPN implementation.

Figure 2:
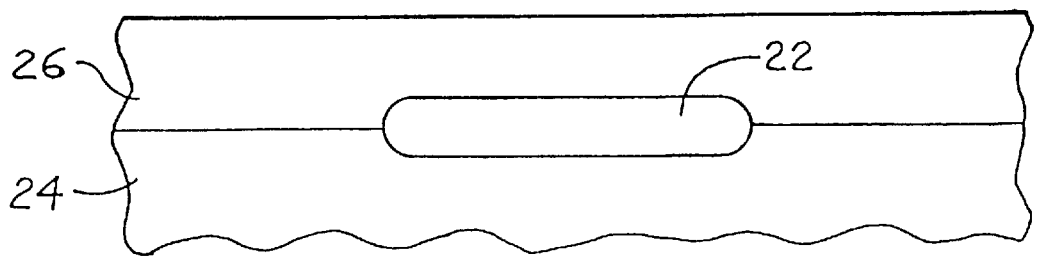

FIG. 2 illustrates a second processing stage that follows the first processing stage depicted in FIG. 1. As illustrated in FIG. 2, a collector layer 26 is epitaxially grown on substrate 24. Buried region 22 is now diffused into both collector layer 26 and substrate 24. Collector layer 26 is a lightly doped N-type conductivity. Phosphorous, antimony or arsenic N-type dopants are used through conventional techniques, such as ion implantation or diffusion, to achieve the desired conductivity type. Buried region 22 allows collector layer 26 to exhibit a low resistance while controlling the breakdown voltage of HBT 20. As understood by those skilled in the art, the thickness of collector layer 26 is selected to achieve application-specific goals. For example, collector layer 26 is desirably thinner to increase the speed of HBT 20 and thicker to increase the breakdown voltage of HBT 20.

Figure 3:
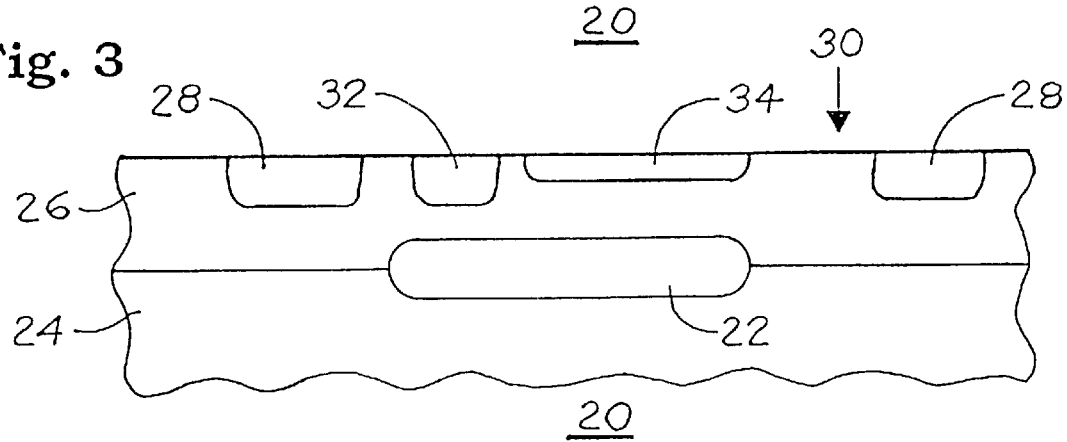

FIG. 3 illustrates a third processing stage that follows the second processing stage depicted in FIG. 2. FIG. 3 shows several independent diffusion areas formed in collector layer 26. A highly doped P-type conductivity isolation diffusion area 28 is made to surround a collector region 30, which provides proper isolation for the final HBT 20. Collector region 30 will eventually serve as the collector of HBT 20. Area 28 desirably refrains from overlying any portion of buried region 22.

A highly doped N-type conductivity contact-enabling diffusion area 32 is made at a location within collector region 30 where a metallized layer will eventually make an electrical collector contact. This location desirably overlies a portion of buried layer 22.

A base region 34 is another diffusion area that is also formed within collector region 30. Base region 34 will eventually serve as the base of HBT 20. Base region 34 is doped to exhibit P-type conductivity for this NPN implementation. Desirably, base region 34 is heavily doped so that the base of HBT 20 will exhibit an unusually low resistance. Diffusion areas 28, 32 and 34 are formed using conventional ion implantation or other techniques. Isolation and contact enabling areas 28 and 32 are desirably formed using a much higher acceleration voltage than base region 34 to drive areas 28 and 32 deeper into collector layer 26 than base region 34.

In an alternate embodiment, a small amount of germanium (Ge) is mixed with the Si of base region 34 to lower the bandgap of the base of HBT 20 when compared to the bandgap of a base formed using more pure Si. This mixing is desirably performed during the second stage depicted in FIG. 2. Small amounts of Ge (e.g. around 10%) with a P+ type doping can be mixed with the Si during only the later portion of epitaxial growth for collector layer 26 to form the base.

Figure 4:
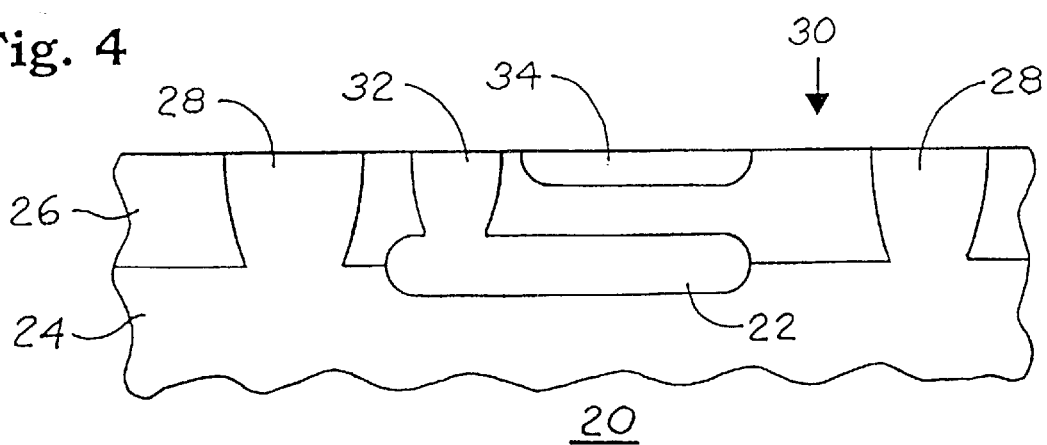

FIG. 4 illustrates a fourth processing stage that follows the third processing stage depicted in FIG. 3. FIG. 4 illustrates heat being applied to further drive diffusion areas 28, 32 and 34 deeper into collector layer 26. Isolation diffusion area 28 is desirably driven through collector layer 26 to substrate 24. Contact enabling area 32 is desirably driven through collector region 30 to buried region 22. However, base region 34 is desirably driven only a shallow depth into collector layer 26. Desirably, base region 34 is around 1000 Å deep. However, the resulting base of HBT 20 will be more shallow than this depth due to subsequent etching steps. This shallow depth of base region 34 leads to a low transit time, which increases the high current gain cut-off frequency (Ft) and high power gain cut-off frequency (Fmax) parameters for HBT 20.

During this fourth stage of processing, heat in excess of 800° C. may be applied to HBT 20 for extended periods of time. However, after this stage the temperature of HBT 20 is desirably maintained below 800° C. to prevent diffusion of non-silicon layers that will be grown over collector layer 26.

Figure 5:
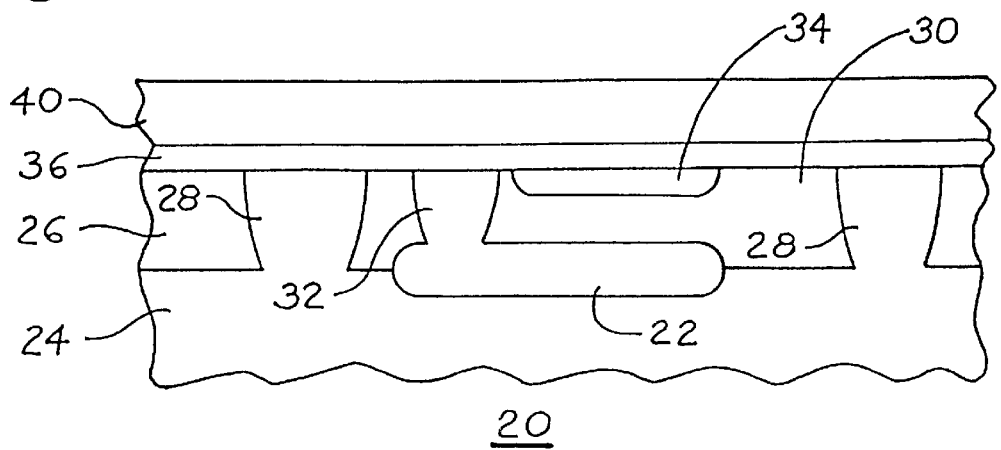

FIG. 5 illustrates a fifth processing stage that follows the fourth processing stage depicted in FIG. 4. FIG. 5 actually illustrates two epitaxial growth processes. The first epitaxial growth process grows a wide bandgap; non-silicon semiconductor, preferably gallium arsenide (GaAs), over and in contact with collector layer 26 to form a first emitter layer 36 of a multilayer emitter 38 (see FIG. 6). First layer 36 may be of N-type conductivity for this NPN implementation or may not be intentionally doped, but is desirably configured so as not to exhibit P-type conductivity. A function of first emitter layer 36 is a diffusion barrier to provide a stable interface with the Si of base region 34.

The second epitaxial growth process grows a second non-silicon, wide bandgap semiconductor, preferably gallium phosphide (GaP), over and in contact with first layer 36 to form a second emitter layer 40 of multilayer emitter 38, Desirably, second layer 40 is degeneratively doped with a suitable N-type conductivity material for this NPN implementation, such as Si, to values in excess of 10×1020/ cm3 to provide a very low emitter contact resistance where a metallized layer will eventually make an electrical emitter contact. Desirably, doping gradually increases as second layer 40 builds away from first layer 36 to reach the maximum value at the distal surface from first layer 36. The function of second emitter layer 40 is to provide maximum valence band discontinuity with minimum lattice mismatch and minimal thermal expansion mismatch with respect to Si.

GaAs is a desirable material for use as an interface with Si because it can form an interface substantially free from interdiffusion, particularly when compared to the interdiffusion that results from forming a GaP layer on Si. In other words, an atomically abrupt interface forms between GaAs layer 36 and base region 34. Desirably, first layer 36 is epitaxially grown using conventional techniques but at a relatively low temperature (e.g. 400–600° C.) to keep the Si-GaAs junction as free from interdiffusion as possible. Alternate cycles of even lower temperatures (e.g. 150–250° C.) may be applied during the growth process. This results in a substantially pure crystalline structure suitable for intrinsic semiconductor activity.

Moreover, first layer 36 is limited in thickness so that first layer 36 will be coherently strained between the Si of base region 34 and second layer 40. Thickness is limited in a manner understood to those skilled in the art by controlling the time over which first layer 36 is grown. A coherently strained layer is a layer so thin that lattice constant mismatches do not result in lattice mismatch crystal defects but are contained by lattice stretching. With first layer 36 made from GaAs and second layer 40 made from GaP, a thickness for layer 36 of less than 200 Å is preferred, with a thickness of less than 50 Å being particularly desirable.

The thickness of second emitter layer 40 is desirably much greater than the thickness of first emitter layer 36. Layer 40 is desirably at least 500 Å thick, and preferably around 2000–3000 Å thick. Less overall thickness is desired for emitter 38. Less thickness leads to a smaller emitter resistance and a faster HBT 20. However, the thickness of emitter 38, and primarily second emitter layer 40, is balanced with a need to prevent the emitter and base of HBT 20 from shorting. Shorting can occur when metallization, discussed below, diffuses through emitter 38 to reach base region 34. A sufficient thickness for second layer 40 prevents metallization from diffusing therethrough.

Second layer 40 is desirably grown epitaxially using standard techniques at temperatures that generally remain in the 400–600° C. range to preserve the substantially interdiffusion-free interface between first emitter layer 36 and base region 34. Although not shown, toward the upper regions of second layer 40, distally removed from first emitter layer 36, temperature may be lowered so that this portion of second emitter layer 40 becomes polycrystalline. Among other benefits, this lessens the time HBT 20 spends at elevated temperatures to further lessen risks of interdiffusion at the base-emitter junction.

While first emitter layer 36 provides an abrupt interface with Si base region 34, second layer 40 provides as great of a bandgap discontinuity as is practical. Thus, the bandgap characteristics of HBT 20 in the vicinity of the base-emitter junction are determined primarily by the bandgap differences between materials used for base region 34 and second layer 40. However, the abruptness of the base-emitter junction (i.e. the congruence of the metallurgical and electrical junctions) is determined primarily by materials used for base region 34 and first layer 36.

Due to the thin, coherently strained nature of first emitter layer 36, base region 34 exhibits few defects. Likewise, second emitter layer 40, although relatively thick, exhibits few defects in part because first emitter layer 36 is sufficiently thin to be coherently strained. Accordingly, not only does first layer 36 provide a clean, abrupt semiconductor junction at base region 34, but first layer 36 allows second layer 40 to be epitaxially grown to a relatively thick width with few defects.

Figure 6:
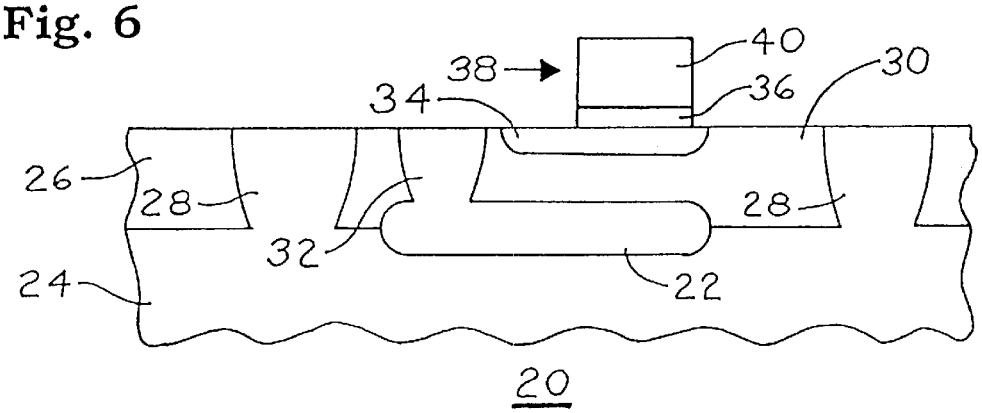

FIG. 6 illustrates a sixth processing stage that follows the fifth processing stage depicted in FIG. 5.

FIG. 6 shows a patterning and etching process. Conventional photolithographic techniques can be used to pattern HBT 20, then etching is performed to remove portions of first and second emitter layers 36 and 40 that will not be used for emitter 38.

Figure 7:
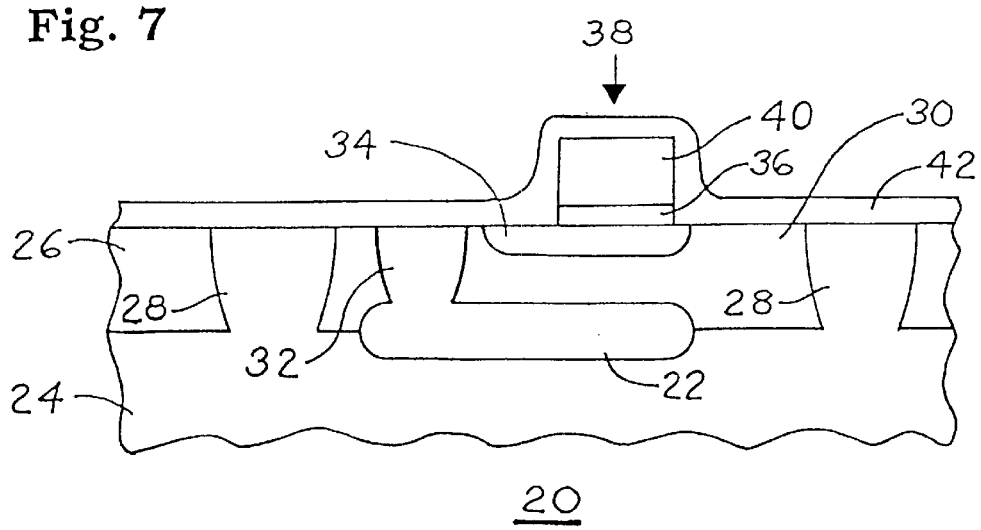

FIG. 7 illustrates a seventh processing stage that follows the sixth processing stage depicted in FIG. 6. FIG. 7 shows a passivation process. Conventional techniques are used to apply a passivation layer 42 over the entire surface of HBT 20 at this point. Silicon nitride, silicon dioxide, or other conventional passivation materials may be applied in a conventional manner, so long as temperatures generally remain below about 800° C.

Figure 8:
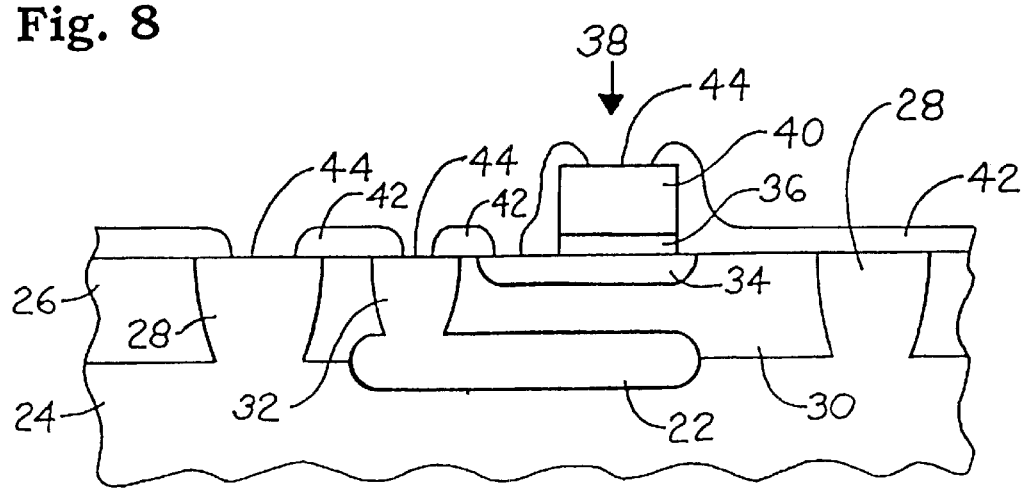

FIG. 8 illustrates an eighth processing stage that follows the seventh processing stage depicted in FIG. 7. FIG. 8 shows another patterning and etching process. Conventional photolithographic techniques can be used to pattern HBT 20, then etching is performed to remove passivation layer 42 to form vias 44 in locations where a metallized layer will eventually make electrical contacts.

Figure 9:
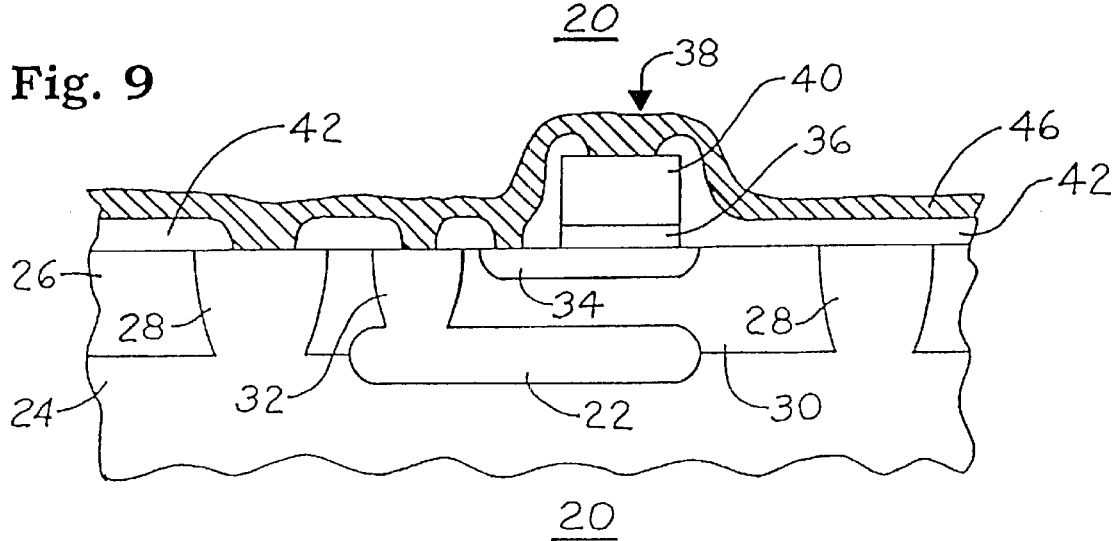

FIG. 9 illustrates a ninth processing stage that follows the eighth processing stage depicted in FIG. 8. FIG. 9 shows a metallization process which uses conventional techniques to deposit a metallized layer 46 over the entire surface of HBT 20.

Figure 10:
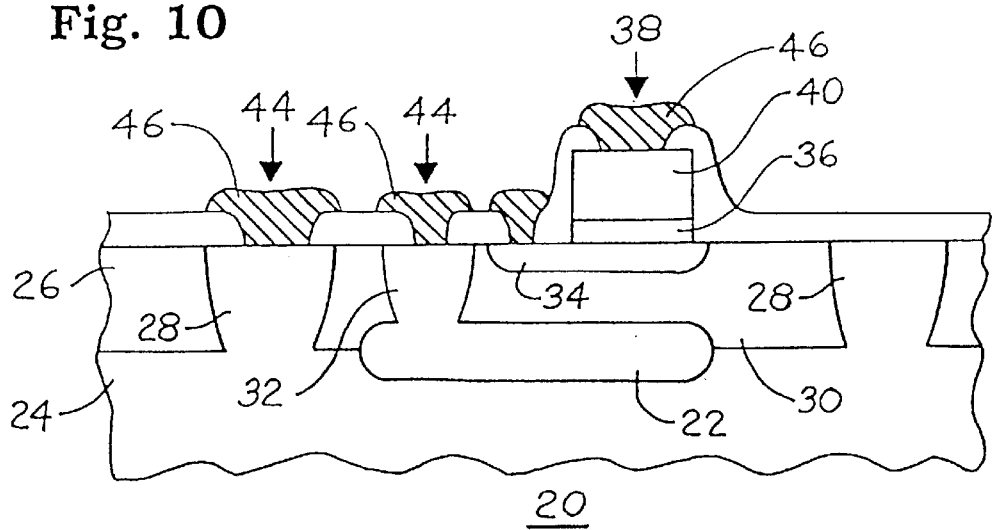

FIG. 10 illustrates a tenth processing stage that follows the ninth processing stage depicted in FIG. 9. FIG. 10 shows yet another patterning and etching process. Conventional photolithographic techniques can be used to pattern HBT 20, then etching is performed to remove metallization layer 46 where not wanted over the surface of HBT 20. However, metallization layer 46 remains within and over vias 44 to form electrical contacts with the base, collector, and emitter regions of HBT 20.

Figure 11:
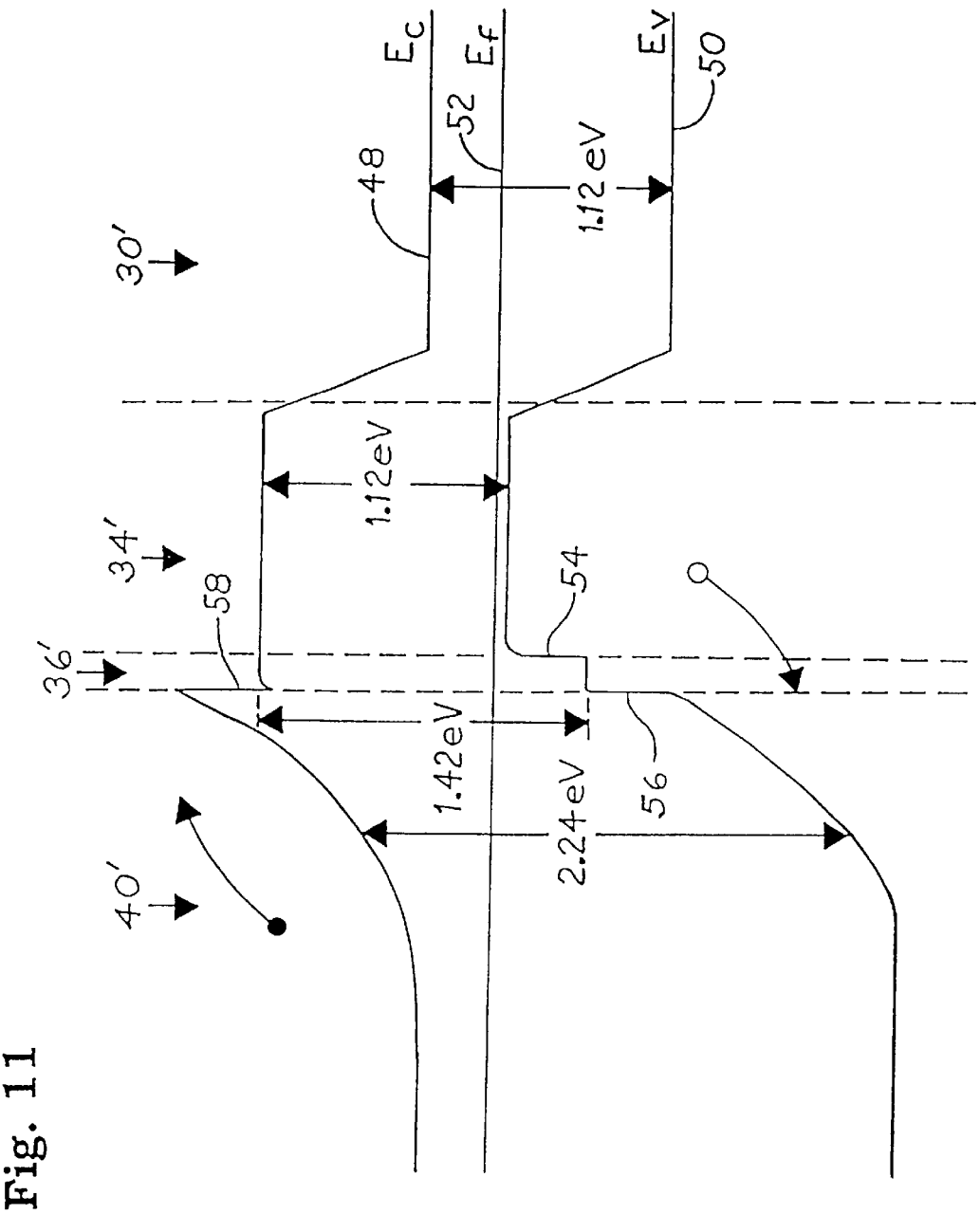
FIG. 11 shows a schematic, zero biased, band diagram of a composite emitter HBT according to a preferred embodiment of the present invention.

FIG. 11 shows a schematic, zero biased, band diagram for HBT 20. FIG. 11 depicts a conduction band ($E_c$) trace 48 and a valence band trace ($E_v$) 50 on vertically opposing sides of a Fermi level ($E_f$) 52. The band diagram of FIG. 11 is horizontally partitioned into four sections 30', 34', 36' and 40' corresponding to collector region 30, base region 34, first emitter layer 36, and second emitter layer 40 (FIG. 10), respectively.

Referring to FIGS. 10–11, in collector region 30 the bandgap energy equals $E_c$–$E_v$, or approximately 1.12 eV. In base region 34 the bandgap energy still equals approximately 1.12. eV. In other words, base region 34 has roughly the same bandgap as collector region 30.

In first emitter layer 36, the bandgap energy equals approximately 1.42 eV. This increase of roughly 0.3 eV from the bandgap of base region 34 and collector region 30 is due to the higher bandgap of GaAs compared to the bandgap of Si. Moreover, substantially all of this 0.3 eV appears as a discontinuity 54 in the valence band $E_v$. Very little of the increase in bandgap achieved by transitioning from Si to GaAs in first layer 36 appears in conduction band $E_c$.

In second emitter layer 40, the bandgap equals approximately 2.24 eV. This represents an increase of roughly 0.8 eV from the bandgap in first emitter layer 36. Accordingly, another discontinuity in the bandgap energy results. This discontinuity is divided between a valence band discontinuity 56 of approximately 0.5 eV and a conduction band discontinuity 58 of approximately 0.3 eV. The total bandgap discontinuity between second layer 40 and base region 36 is approximately 1.1 eV, with the majority of the discontinuity appearing in the valence band $E_v$. The majority of the discontinuity appearing in the valence band $E_v$ is desirable for NPN transistors because it is the parameter that characterizes the suppression of hole injection.

Not only does first layer 36 provide a stable, abrupt semiconductor junction at base region 34 and simultaneously allow second layer 40 to be epitaxially grown with few defects, but first layer 36 also causes a larger portion of the total bandgap discontinuity between emitter 38 and base region 34 to appear as a valence band discontinuity, which is particularly useful in suppressing hole injection. This relatively large valence band discontinuity significantly suppresses hole injection from base region 34 to emitter 38, creating an HBT with greatly improved emitter injection efficiency compared to prior art HBTs.

FIGS. 12–21 show sectional views of an HBT 60 at first through tenth processing stages, respectively. HBT 60 is an alternate embodiment to HBT 20, discussed above. In general, HBT 60 is an upside down implementation of HBT 20, with an emitter region of the GaP layer being the bottom-most portion of the intrinsic transistor and being surrounded by a GaP region that is configured to be substantially insulative. HBT 60 operates substantially in accordance with the band diagram illustrated in FIG. 11.

Figure 12:
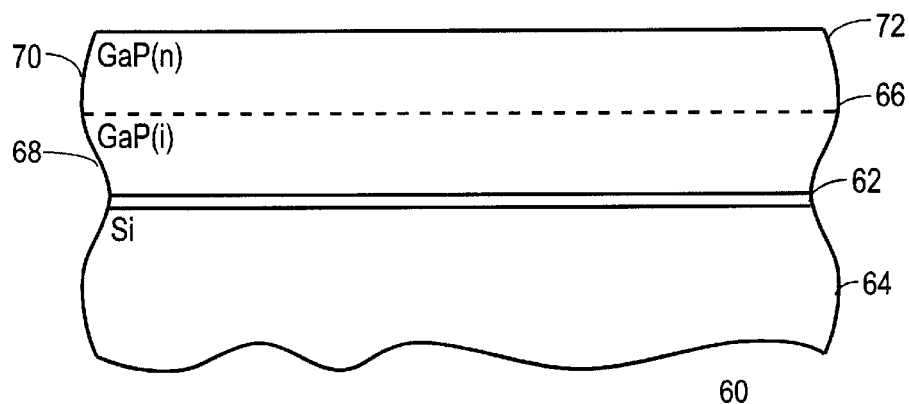
FIGS. 12–18 show sectional views of a second embodiment of an HBT at first through seventh processing stages, respectively.

FIG. 12 illustrates a first processing stage in which a non-silicon semiconductor layer 62, preferably gallium arsenide (GaAs) is epitaxially grown over and in contact with a silicon (Si) substrate 64, and another non-silicon semiconductor layer 66, preferably gallium phosphide (GaP) is then epitaxially grown over and in contact with layer 62. Preferably, substrate 64 is undoped and left to exhibit its intrinsic doping so that it will exhibit low conductivity for improved radiation tolerance and reduced capacitance with the intrinsic transistor, discussed below.

As with layer 36, discussed above in connection with the first embodiment, layer 62 is limited in thickness so that it will be coherently strained between Si substrate 64 and layer 66. With layer 62 made from GaAs, a thickness of less than 200 Å is preferred, with a thickness of less than 50 Å being particularly desirable. Layer 62 is extrinsic to HBT 60 and serves primarily as a buffer between Si substrate 64 and the above-layer. However, layer 62 also substantially prevents interdiffusion at the boundary between substrate 64 and layer 62 and the formation of a conductive region due to any interdiffusion.

In an alternate embodiment (not shown) layer 62 may be omitted, and layer 66 grown to a greater thickness than would be needed when layer 62 is included. In this alternative, defects are likely to form in layer 66 near substrate 64, but such defects are minimized as layer 66 becomes thicker.

Layer 66 is preferably a wide bandgap semiconductor that exhibits or can be selectively made to exhibit good insulative qualities and exhibits good or can be made to exhibit good thermal conductivity qualities. Preferably, GaP is used for layer 66. Desirably, layer 66 is grown to a large thickness, preferably greater than 5000 Å when layer 62 is present, but this is not a requirement of the present invention. Standard techniques, as discussed above in connection with the first embodiment, may be used to grow layer 66.

As indicated by a dotted line in FIG. 12, layer 66 is divided into an undoped region 68 and a doped region 70. In undoped region 68, layer 66 is desirably formed to exhibit insulative properties, such as the insulative properties demonstrated by GaP which exhibits only its intrinsic doping [GaP(i)]. In doped region 70, layer 66 is desirably doped to exhibit "N" type doping [GaP(n)] in this NPN example. Doping may be accomplished by adding a suitable dopant while growing region 70 of layer 66. Layer 66 exhibits increased conductivity in region 70 due to the doping.

In this embodiment, doped region 70 will provide an outside layer, which also serves as a penultimate inside layer, of a multilayer emitter 72 for HBT 60. Accordingly, doped region 70 is intrinsic to HBT 60, but non-doped region 68 is extrinsic to HBT 60 because it does not take a substantial part in the electrical activity of HBT 60. The function of doped region 70 is similar to that of second layer 40, discussed above in connection with the first embodiment.

The depth of doped region 70 in layer 66 desirably varies to achieve application goals. Generally, a high speed transistor will benefit from doped region 70 being relatively shallow so that emitter resistivity is raised and base-emitter junction capacitance is lowered. Moreover, a greater thickness for insulative, undoped layer 68 is desirable because it decreases capacitance with layers underlying the intrinsic transistor and improves radiation tolerance.

Figure 13:
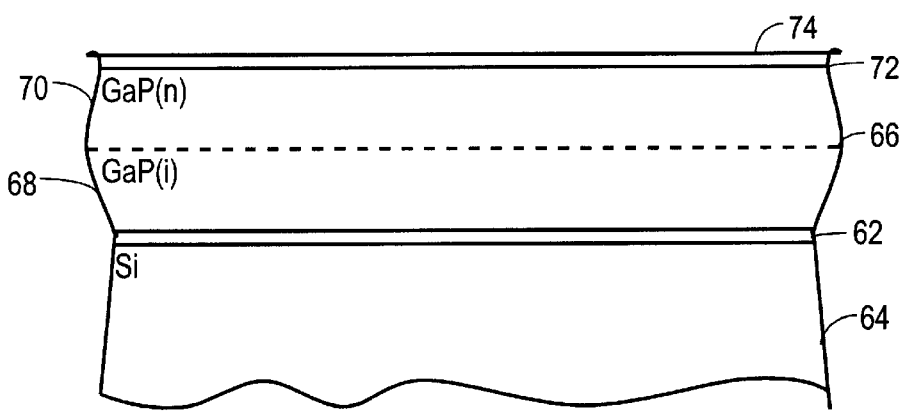

FIG. 13 illustrates a second processing stage that follows the first processing stage depicted in FIG. 12. In this second stage, a third non-silicon, semiconductor layer 74 is grown over and in contact with layer 66. Layer 74 has a function similar to that of layer 36, discussed above. In particular, layer 74 provides an interdiffusion barrier between layer 66 and subsequent Si layers, discussed below, and layer 74 buffers between the different materials used for layer 66 in the subsequent Si layers. Layer 74 is desirably formed substantially of GaAs.

Layer 74 is limited in thickness so that layer 74 will be coherently strained between layer 66 and subsequent Si layers. With layer 74 made from GaAs and layer 66 made from GaP, a thickness for layer 74 of less than 200 Å is preferred, with a thickness of less than 50 Å being more desirable. Layer 74 may be lightly N-type doped for this NPN implementation or may exhibit its intrinsic doping but is preferably configured not to intentionally exhibit P-type conductivity. Layer 74 provides an inside layer, which also serves as a penultimate outside layer, of multilayer emitter 72 for HBT 60, and is therefore an intrinsic part of HBT 60.

Figure 14:
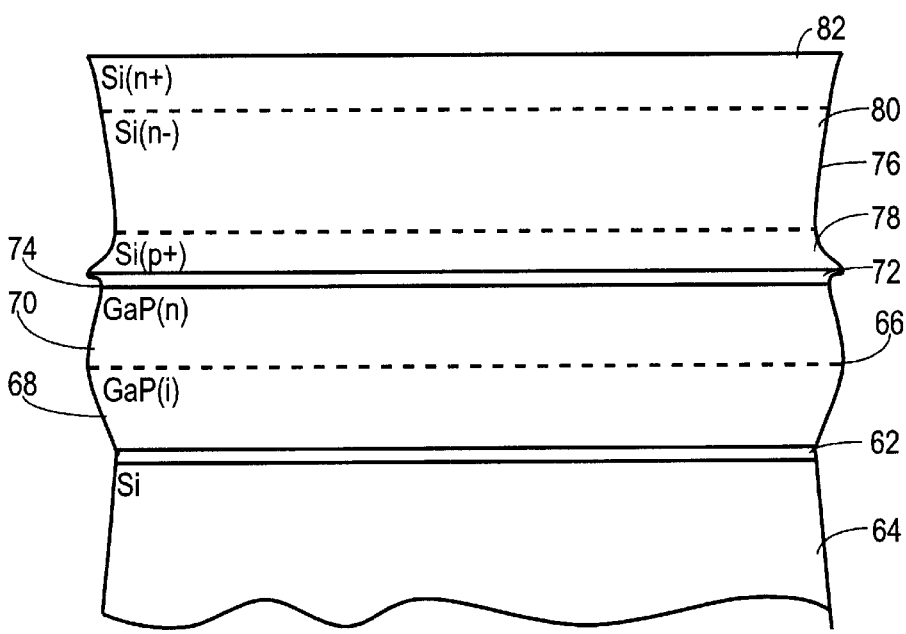

FIG. 14 illustrates a third processing stage that follows the second processing stage depicted in FIG. 13. In this third stage, a Si layer 76 is epitaxially grown over and in contact with layer 74. In accordance with conventional processing techniques, layer 76 may be grown in a chamber separate from the chamber used to grow layers 62, 66 and 74 to minimize the risk of chamber contamination. In order to move the wafer to a new chamber, a thin (e.g., 50 Å) Si layer (not shown) may be temporarily grown on layer 74 to protect the exposed surface of layer 74, then this temporary layer removed through etching when the wafer has been moved into the new chamber.

Layer 76 is preferably grown to exhibit three regions of differing conductivity type. A region 78, which will serve as the base of HBT 60, is grown over and in contact with layer 74. The boundary between layer 74 and base region 78 will serve as the base-emitter junction for HBT 60. Since layers 66 and 74 are non-silicon layers and base 78 is a silicon layer, a heterojunction results.

Si layer 76 and subsequent processing stages are desirably grown while keeping temperatures below 800° C. to preserve an abrupt base-emitter junction. Base 78 is heavily doped to exhibit P-type conductivity [Si(p+)] for this NPN implementation by adding a suitable dopant while growing base 78 of layer 66. Desirably, base 78 is heavily doped so that the base of HBT 60 will exhibit an unusually low resistance. A small amount of Ge may be mixed with the Si of base 78 to lower the bandgap of the base of HBT 60 when compared to the bandgap of a base formed using more pure Si. Desirably, base 78 is grown to a thickness greater than 1000 Å, with a thinner base 78 being more desirable for higher speed characteristics.

Si layer 76 is grown to include a collector region 80 over and in contact with base 78. Collector 80 may be grown to a thickness of greater than 2000 Å, with less thickness being more desirable in lower voltage applications. As a minimum, layer 76 needs to be sufficiently thick so that subsequent metallization does not diffuse through collector 80 to short with base 78. Collector 80 is lightly doped to exhibit N-type conductivity [Si(n−)] for this NPN implementation by adding a suitable dopant while growing collector 80.

Si layer 76 is also grown to include a collector-contact-enabling region 82 over and in contact with collector region 80. Region 82 may have a thickness in the range of 1000–4000 Å. Region 82 differs from region 80 in that region 82 is highly doped [Si(n+)] to enable an interface with a metal contact, to be applied later. Regions 80 and 82 will be collectively referred to below simply as collector 80.

Figure 15:
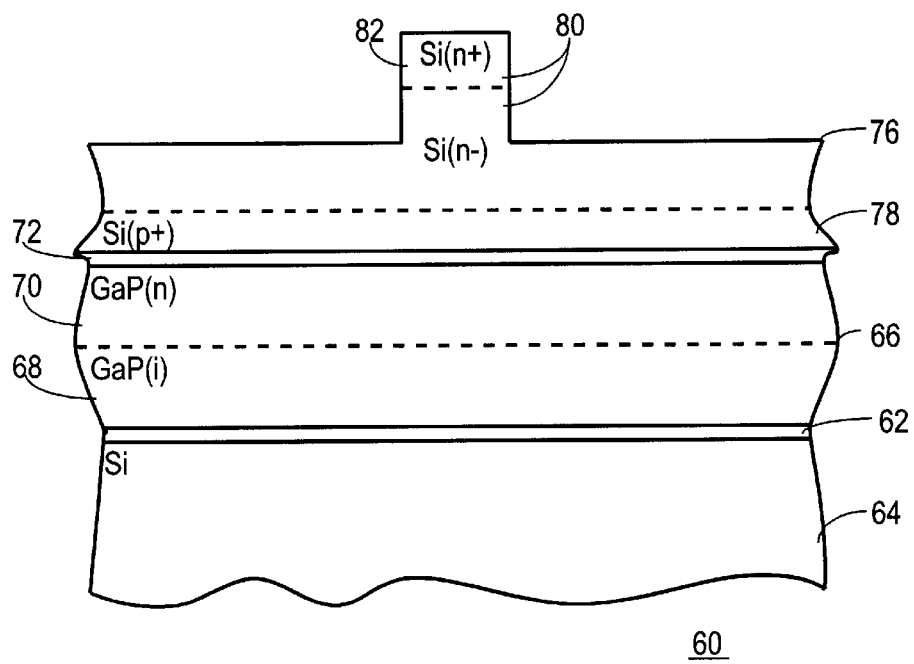

FIG. 15 illustrates a fourth processing stage that follows the third processing stage depicted in FIG. 14. FIG. 15 shows a patterning and etching process. Conventional photolithographic techniques can be used to pattern HBT 60, then etching is performed to remove a portion of regions 82 and 80 from Si layer 76 so that only the feature that will be used as collector 80 for HBT 60 remains. Desirably, etching is stopped below heavily doped, contact-enabling region 82 and somewhere in the middle of the lightly doped region 80. The precise location for stopping the etching process is not a critical parameter. FIG. 15 illustrates HBT 60 following the removal of a mask used in this etching process. Collector 80 will be centrally located in HBT 60.

Figure 16:
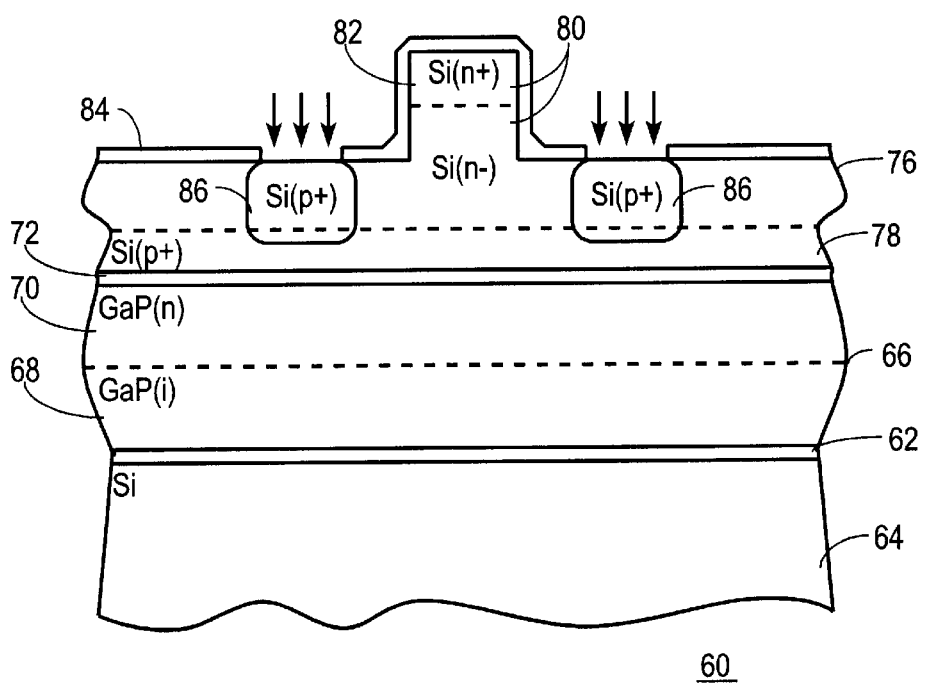

FIG. 16 illustrates a fifth processing stage that follows the fourth processing stage depicted in FIG. 15. FIG. 16 shows a masking and ion implantation process. Conventional photolithographic and etching techniques can be used to pattern and etch HBT 60 to form a suitable mask 84 (e.g., Si3N4), then ion implantation is performed in base-contact-enabling areas 86. Implantation energies are adjusted to that a highly conductive P-type dopant (p+) for this NPN example is driven through the remaining portion of lightly doped Si(n−) region 80 into, but not through, base 78 at base-contact-enabling areas 86. The highly conductive p+ dopant overwhelms the lightly conductive n-dopant to result in areas 86 being Si(p+). Implantation may occur in two steps, with a higher energy implantation step followed by a lower energy implantation step. The higher energy step causes the dopant to be driven to a large depth and the lower energy step causes the dopant to be driven only to a small depth so that base-contact-enabling areas 86 are continuous Si(p+) regions from the exposed surface down into base 78.

Figure 17:
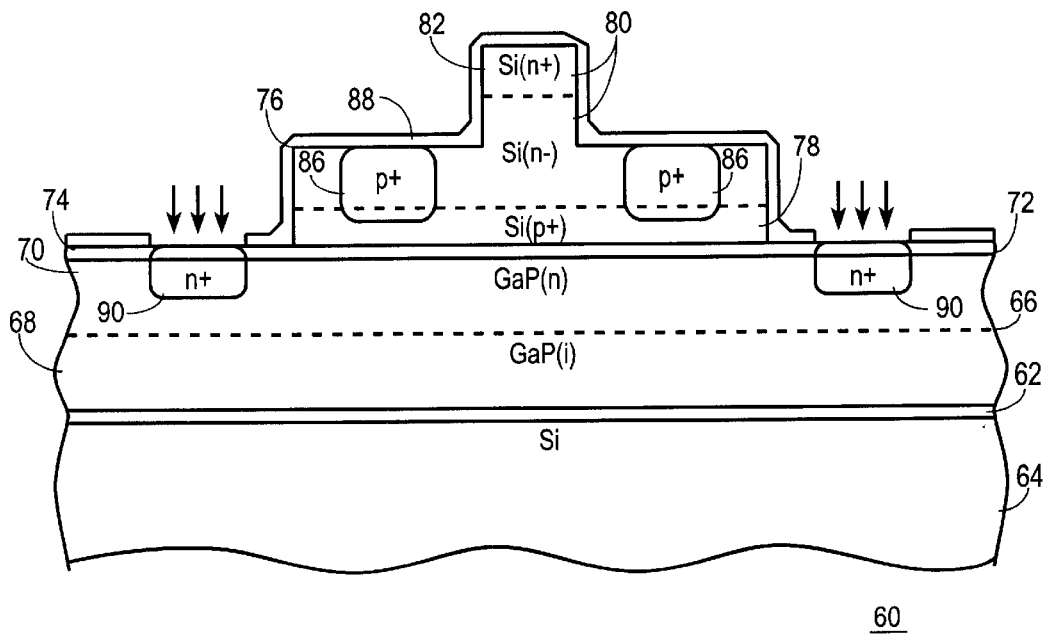

FIG. 17 illustrates a sixth processing stage that follows the fifth processing stage depicted in FIG. 16. Compared to the fifth processing stage of FIG. 16, mask 84 is removed, and conventional photolithographic and etching techniques have been performed to remove remaining portions of Si layers 78 and 80 not needed for collector 80 or base 78. The removed portions are outside of base-contact-enabling areas 86. The remaining portion of layer 76 forms base 78 and collector 80. After this patterning and etching step, a masking and ion implantation process is performed to apply a suitable mask 88 (e.g., Si3N4) which has openings in emitter-contact-enabling areas 90. When mask 88 has been applied, ion implantation is performed in emitter-contact-enabling areas 90 by driving a suitable highly conductive n+ dopant for this NPN example through GaAs layer 74 into doped region 70 of GaP layer 66.

Figure 18:
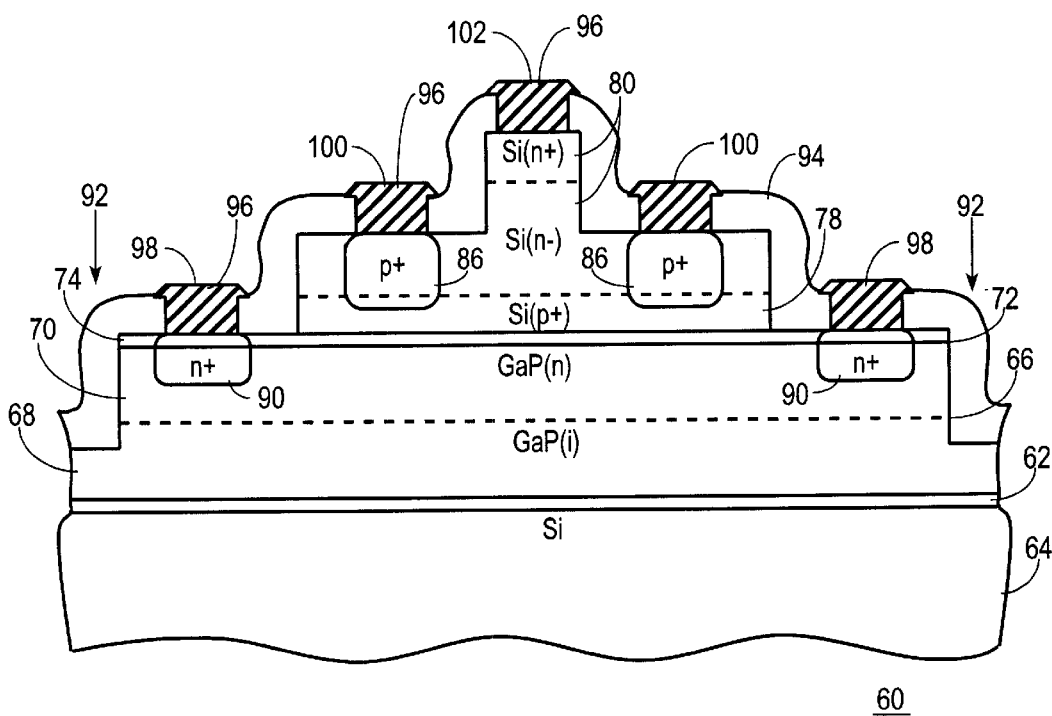

FIG. 18 illustrates a seventh processing stage that follows the sixth processing stage depicted in FIG. 17. FIG. 18 shows isolation, passivation and metallization processes. In particular, FIG. 18 depicts etching of an isolation well 92, the application of a passivation layer 94, and then the application of a metallization layer 96.

First, a suitable mask is applied (not shown) and well 92 etched around the perimeter of HBT 60 to isolate HBT 60 from other transistors and devices (not shown) formed over substrate 64. Well 92 is etched into insulative region 68 in layer 66, or deeper, for effective isolation. While the area surrounded by well 92 is not a critical parameter of the present invention, a smaller area is desirable for higher transistor density and faster performance.

Next, conventional techniques are used to apply passivation layer 94 over the entire surface of HBT 60 at this point. Silicon nitride, silicon dioxide, or other conventional passivation materials may be applied in a conventional manner, so long as temperatures generally remain below about 800° C. Then, a patterning and etching process is performed in which conventional techniques may be used to pattern HBT 60 and remove selected portions of passivation layer 94 to form vias in locations where metallization layer 96 will eventually make electrical contacts with the emitter, base and collector of HBT 60.

Finally, conventional techniques may be used to deposit metallization layer 96 over the entire surface of HBT 60. After deposition of metallization layer 96, another patterning and etching process removes metallization layer 96 where not wanted over the surface of HBT 60. However, metallization layer 96 remains within and over the above-discussed vias to form an emitter contact 98 at emitter-contact-enabling areas 90, a base contact 100 at base-contact-enabling areas 86, and a collector contact 102 at collector 80. Collector contact 102 is centrally located (i.e. innermost) within HBT 60. Base contact 100 is intermediately located within HBT 60 and may substantially surround collector contact 102. Emitter contact 98 is peripherally located (i.e. outermost) within HBT 60 and may substantially surround base contact 100 and collector contact 102. In addition, the pattern of metallization is configured so that metallization layer 96 is routed to other circuits and/or pads to make HBT 60 usable in an electrical circuit.

Due to the thin, coherently strained nature of emitter layer 74, emitter 72 and base 78 exhibit few defects. Moreover, emitter 72 provides a clean, abrupt semiconductor junction at base layer 78, and allows base 78 and collector 80 to be epitaxially grown to a relatively thick width with few defects. The band diagram depicted in FIG. 11 applies for HBT 60 as discussed above for HBT 20.

Referring to FIGS. 10 and 18, HBT 60 (FIG. 18) is upside down relative to HBT 20 (FIG. 10). In both HBT 20 and HBT 60 a multilayer, non-silicon emitter forms a base-emitter junction with a Si base, and the collector, base and emitter are arranged vertically. The emitter is on the top in HBT 20 (i.e., distally located relative to substrate 24), but on the bottom in HBT 60 (i.e., proximally located relative to substrate 64). In the preferred embodiments, GaP is used for the outermost emitter layer which is intrinsic to HBTs 20 and 60.

In HBT 60 (FIG. 18), the intrinsic portion of GaP layer 66 is confined to doped region 70. However, doped region 70, and the other features that are intrinsic to HBT 60, are spaced apart from substrate 64 and from other HBTs 60 (not shown) which may be formed over the same substrate 64 by undoped region 68 of GaP layer 66. In the preferred embodiments, undoped region 68 exhibits the good insulative properties and good thermal conductivity properties characteristic of undoped GaP. Accordingly, the insulative properties promote lower parasitic capacitance and improved speed along with less electron disturbance in the presence of radiation and improved radiation tolerance. The good thermal conductivity properties allow heat generated by the intrinsic portions of HBT 60 to be readily conducted to Si substrate 64, which is also a good thermal conductor. Accordingly, a greater number of HBTs 60 may be formed on substrate 64 or higher power HBTs 60 may be formed.

In summary, an improved HBT having a wide bandgap with a low interdiffusion base-emitter junction is provided along with methods for forming the HBT. The HBT uses a Si substrate, which is desirable because the use of a Si substrate takes advantage of the existing manufacturing infrastructure that reliably produces relatively rugged Si wafers at low cost.

A multilayer emitter is provided in the HBT. This emitter exhibits a wide bandgap, and the resulting base-emitter junction is substantially free of interdiffusion. In a preferred embodiment, the HBT is provided with a Si base that forms a heterojunction with a multilayer emitter having a thin GaAs layer proximate the base and a distal GaP layer. The base-emitter junction and the wide bandgap multilayer emitter together allow an HBT configured in accordance with the present invention to exhibit performance more closely meeting theoretical expectations than does the performance of conventional HBTs. In one embodiment, the HBT uses a Si substrate and a substantially insulative crystalline layer grown thereon, with the features intrinsic to the HBT formed in and above this insulative crystalline layer.

The present invention has been described above with reference to preferred embodiments. However, those skilled in the art will recognize that changes and modifications may be made in these preferred embodiments without departing from the scope of the present invention. For example, while the above-presented description discusses the formation of a single HBT, those skilled in the art will readily recognize that a multiplicity of HBTs may be simultaneously formed as described above, or in an equivalent manner, for integrated circuit or discrete transistor applications. These and other changes and modifications which are obvious to those skilled in the art are intended to be included within the scope of the present invention.

What is claimed is:

1. A vertical heterojunction bipolar transistor comprising:
   a gallium phosphide layer (GaP) configured to exhibit a first conductivity type, said GaP layer forming a first portion of a multilayer emitter;
   a Si substrate positioned underneath said GaP layer;
   a first gallium arsenide (GaAs) layer formed in contact with said GaP layer, said first GaAs layer forming a second portion of said multilayer emitter;
   a second GaAs layer between said Si substrate and said first GaP layer;
   a silicon (Si) base region of a second conductivity type formed in contact with said first GaAs layer; and
   a Si collector region of said first conductivity type formed adjacent to said Si base region.

2. A vertical heterojunction bipolar transistor as claimed in claim 1 wherein:

said GaP layer is configured to have a first region doped to exhibit said first conductivity type, said first region of said GaP layer being in contact with said first GaAs layer and forming said first portion of said multilayer emitter; and said GaP layer is configured to have a second region in contact with said second GaAs layer, said second region being substantially insulative.

* * * * *

UNITED STATES PATENT AND TRADEMARK OFFICE
CERTIFICATE OF CORRECTION

PATENT NO. : 6,423,990 B1
DATED : July 23, 2002
INVENTOR(S) : El-Sharawy et al.

It is certified that error appears in the above-identified patent and that said Letters Patent is hereby corrected as shown below:

Column 5,
Line 54, replace "emitter 38," with -- emitter 38. --.

Column 12,
Line 61, replace "first GaP" with -- GaP --.

Signed and Sealed this

Twelfth Day of November, 2002

*Attest:*

JAMES E. ROGAN
*Attesting Officer*     *Director of the United States Patent and Trademark Office*